(12) United States Patent
Cho et al.

(10) Patent No.: US 6,728,588 B2
(45) Date of Patent: *Apr. 27, 2004

(54) APPARATUS AND METHOD FOR AUTOMATICALLY CONTROLLING SEMICONDUCTOR MANUFACTURING PROCESS IN SEMICONDUCTOR FACTORY AUTOMATION SYSTEM

(75) Inventors: Won-Soo Cho, Ichon-shi (KR); Jin-Ho Jang, Ichon-shi (KR); Byung-Woon Kim, Ichon-shi (KR)

(73) Assignee: Hyundai Electronics Industries Co., Ltd., Ichon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/576,322

(22) Filed: May 22, 2000

(65) Prior Publication Data

US 2003/0109945 A1 Jun. 12, 2003

(30) Foreign Application Priority Data

May 20, 1999 (KR) .............................. 99-18263

(51) Int. Cl.[7] .............................................. G06F 19/00
(52) U.S. Cl. ........................ 700/110; 700/109; 700/121; 438/14; 702/185
(58) Field of Search ............................... 700/110, 109, 700/121; 438/14; 702/185

(56) References Cited

U.S. PATENT DOCUMENTS

| 4,571,685 | A |   | 2/1986  | Kamoshida |          |
|-----------|---|---|---------|-----------|----------|
| 4,901,242 | A |   | 2/1990  | Kotan     |          |
| 5,105,362 | A |   | 4/1992  | Kotani    |          |
| 5,111,404 | A |   | 5/1992  | Kotani    |          |
| 5,231,585 | A |   | 7/1993  | Kobayashi et al. |   |
| 5,262,954 | A |   | 11/1993 | Fujino et al. |      |
| 5,375,062 | A |   | 12/1994 | Aoki      |          |
| 5,402,349 | A |   | 3/1995  | Fujita et al. |      |
| 5,440,493 | A |   | 8/1995  | Doida     |          |
| 5,495,417 | A |   | 2/1996  | Fuduka et al. |      |
| 5,555,179 | A |   | 9/1996  | Koyama et al. |      |
| 5,568,408 | A |   | 10/1996 | Maeda     |          |
| 5,579,231 | A |   | 11/1996 | Sudou et al. |       |
| 5,596,712 | A |   | 1/1997  | Tsuyama et al. |     |
| 5,923,553 | A | * | 7/1999  | Yi .................. | 700/110 |
| 5,930,137 | A | * | 7/1999  | Togashi ........... | 700/100 |
| 6,272,437 | B1 | * | 8/2001 | Woods et al. ..... | 700/110 |
| 6,338,001 | B1 | * | 1/2002 | Steffan et al. .... | 700/121 |
| 6,363,294 | B1 | * | 3/2002 | Coronel et al. ... | 700/121 |
| 6,405,094 | B1 | * | 6/2002 | Ueda et al. ....... | 700/112 |
| 6,408,219 | B2 | * | 6/2002 | Lamey, Jr. et al. | 700/110 |
| 6,438,440 | B1 | * | 8/2002 | Hayashi ........... | 700/121 |
| 6,556,955 | B2 | * | 4/2003 | Yoshitake et al. . | 702/185 |

FOREIGN PATENT DOCUMENTS

| GB | 2126374 A |   | 3/1984 | ........... G05B/15/02 |
| GB | 2126374 A | * | 3/1984 | ........... G05B/13/02 |
| JP | 09-180976 |   | 7/1997 | ........... H01L/21/02 |

* cited by examiner

Primary Examiner—Leo Picard
Assistant Examiner—Alexander Kosowski
(74) Attorney, Agent, or Firm—Jacobson Holman PLLC

(57) ABSTRACT

A method for automatically controlling a semiconductor manufacturing process in a semiconductor factory, includes the steps of: a) receiving a lot specification data and a lot process data; b) comparing the lot specification data with the lot process data to determine whether a difference between the lot specification data and the lot process data is within a predetermined range; c) if a difference between the lot specification data and the lot process data exceeds or falls below a predetermined range, generating a first message representing an occurrence of an abnormally manufactured lot; d) generating a first transaction in response to the first message, the first transaction representing that the lot is abnormally manufactured; and e) storing the first transaction into a storage unit, so that a next lot process to the abnormally manufactured lot is prevented.

9 Claims, 3 Drawing Sheets

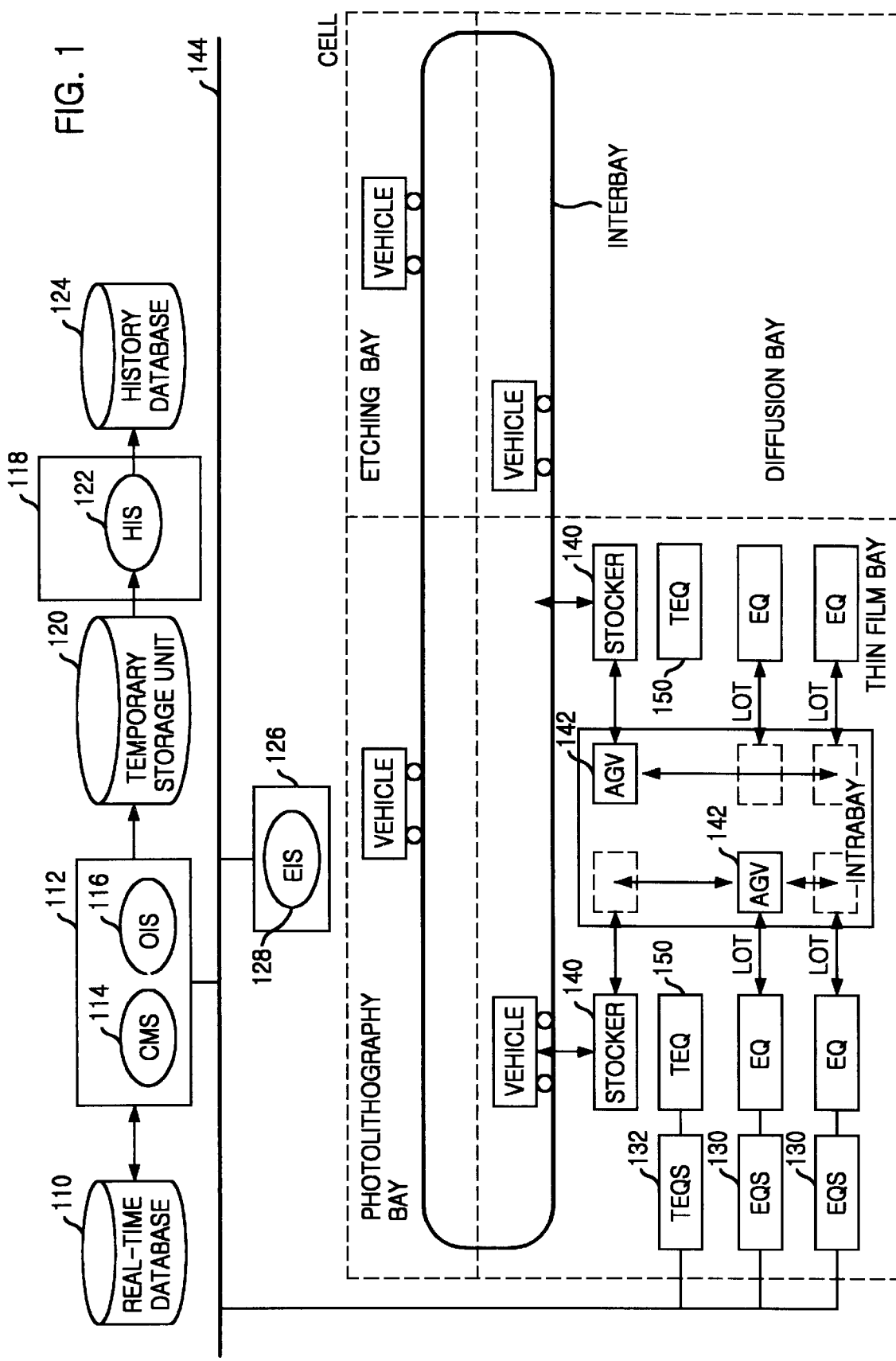

APPARATUS AND METHOD FOR AUTOMATICALLY CONTROLLING SEMICONDUCTOR MANUFACTURING PROCESS IN SEMICONDUCTOR FACTORY AUTOMATION SYSTEM

FIELD OF THE INVENTION

The present invention relates to an apparatus and method for automatically controlling a semiconductor manufacturing process in a semiconductor factory automation system, capable of improving a manufacturing efficiency and yield.

DESCRIPTION OF THE PRIOR ART

A semiconductor device is generally manufactured on a semiconductor wafer through various unit processes, e.g., a photolithography process, an etching process, a thin film process and a diffusion process. A plurality of process equipments are used in each unit process. Generally, each unit process is typically performed based on a predetermined number of semiconductor wafers, referred to as a lot.

In manufacturing the semiconductor device, however, an abnormally manufactured lot may occur which has a process result data exceeding or falling below a predetermined level required in a lot specification. The abnormally manufactured lot may occur due to a problem of a lot itself, a problem of equipment conditions, a problem of manufacturing steps and the like.

A method for controlling a semiconductor manufacturing process by failure analysis feedback is disclosed in U.S. Pat. No. 5,923,553 issued to Yi, filed on Oct. 5, 1996. The method includes the steps of: a) the establishing a monitoring database with abnormal process condition data, the abnormal process condition data being obtained by a correlation between a yield for each manufactured lot and corresponding process conditions for semiconductor equipment when the yield is lowered or semiconductor equipment malfunctions have occurred; b) establishing an equipment data base by obtaining real-time process conditions for on-line semiconductor equipment; c) comparing the real-time process conditions for on-line semiconductor equipment with the abnormal process conditions of the monitoring data base; and d) stopping the operation of the on-line semiconductor equipment when differences between the real-time and abnormal process conditions fall below a predetermined level.

At this time, Yi's patent discloses that the causes of the abnormally manufactured lot is the equipment or the process condition malfunction. For solving the problem, the operation of the corresponding equipment is stopped. However, the abnormally manufactured lot may mainly occur due to the processed lot itself.

As can be seen above, however, even when a lot is abnormally manufactured in the middle of the lot process, a following process is continued without considering the abnormally manufactured lot until a completion of the entire lot process. Therefore, a manufacturing efficiency is reduced.

SUMMARY OF THE INVENTION

It is, therefore, an object of the present invention to provide an apparatus and method for automatically controlling a semiconductor manufacturing process in a semiconductor factory automation system, capable of improving an efficiency in manufacturing semiconductor devices.

In accordance with an aspect of the present invention, there is provided an apparatus for automatically controlling a semiconductor manufacturing process in a semiconductor factory automation system, comprising: a common communication line; a plurality of equipments, coupled to the common communication line, each processing a lot; a plurality of equipment control means, each converting command message from an exterior into command to control each equipment; a plurality of test equipments, each testing the processed lot to generate a lot process data; a plurality of test equipment control means, each receiving the lot process data to transfer the lot process data; a storage means for storing the lot process data and a lot specification data, respectively; a comparison means, coupled to the common communication line, for comparing the lot process data with the lot specification data to determine whether a difference between the processed lot data and the lot specification data exceeds or falls below a predetermined range, wherein if the difference exceeds or falls below the predetermined range, the comparison means generates a first message representing an occurrence of an abnormally manufactured lot; and a transaction generation means, coupled to the common communication cable, for generating a first transaction in response to the first message, the first transaction representing that the lot is abnormally manufactured, wherein a next lot process to the abnormally manufactured lot is prevented.

In accordance with another aspect of the present invention, there is provided a method for automatically controlling a semiconductor manufacturing process in a semiconductor factory, comprising the steps of: a) receiving a lot specification data and a lot process data; b) comparing the lot specification data with the lot process data to determine whether a difference between the lot specification data and the lot process data is within a predetermined range; c) if a difference between the lot specification data and the lot process data exceeds or falls below a predetermined range, generating a first message representing an occurrence of an abnormally manufactured lot; d) generating a first transaction in response to the first message, the first transaction representing that the lot is abnormally manufactured; and e) storing the first transaction into a storage means, wherein a next lot process to the abnormally manufactured lot is prevented.

BRIEF DESCRIPTION OF THE DRAWINGS

Other objects and aspects of the invention will become apparent from the following description of the embodiments with reference to the accompanying drawings, in which:

FIG. 1 is a schematic diagram illustrating a semiconductor factory automation system.

DETAILED DESCRIPTION OF THE PREFERRED EMBODIMENTS

Figure 2A:
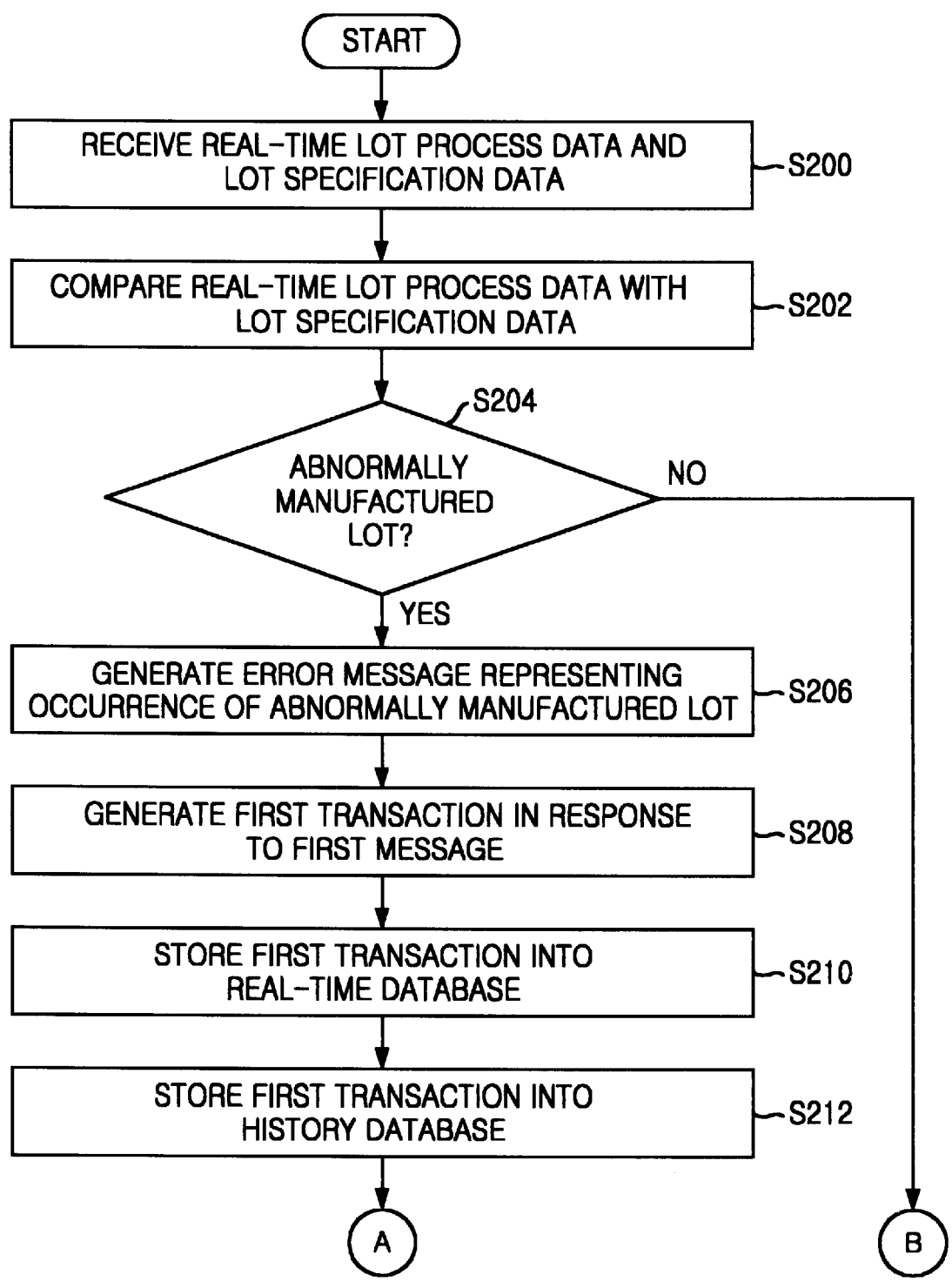
FIGS. 2A and 2B are flow charts illustrating processing steps of a method for automatically controlling a semiconductor manufacturing process in a semiconductor factory automation system in accordance with the present invention.

In order to manufacture semiconductor devices, a plurality of semiconductor production bays are typically installed in a semiconductor factory automation system, and the semiconductor production bays are connected to a cell management system via a communication line. For the sake of convenience, the present invention will be described with only one semiconductor production bay.

Referring to FIG. 1, there is shown a semiconductor factory automation system in accordance with the present invention.

As shown, a semiconductor factory automation system includes a cell management portion 112 for managing a cell, the cell including a plurality of semiconductor production bays, a real-time database 110, coupled to the cell management portion 114, for storing a real-time lot process data, a temporary storage unit 120, coupled to the cell management portion 114, for receiving data and transaction from an exterior to store them in a form of temporary file, a history management portion 118, coupled to the temporary storage unit 120, for receiving the data and transaction from the temporary storage unit 120 and storing the received data and transaction into the history database 124 coupled to the history management portion 118. The cell management portion 114, the history management portion 118 and the history database 124 are respectively coupled to the common communication line 114 for communication therebetween. Ethernet™ supplied by Xerox corporation can be used as the common communication line.

The semiconductor factory automation system also includes a comparison portion 126 for comparing a real-time lot process data with a lot specification data to determine whether a difference between them is within a predetermined range set by an user. At this time, the lot specification data is previously stored in the real-time database 110.

Here, the semiconductor production bay includes a plurality of process equipments EQ, also called station, for processing a lot, a plurality of equipment servers 130 for controlling the process equipments EQ according to command message from the cell management portion 112, test equipments 150 for testing a processed lot to supply the real-time lot process data, stockers 140 for stocking cassettes (not shown) containing a predetermined number of lots, automatic guided vehicles 142 moving along an intrabay to transfer the cassette containing the processed lot, and vehicles moving along an interbay to transfer the cassette from one semiconductor production bay to another semiconductor production bay.

For the convenience of simplicity, although a thin film bay as the semiconductor production bay is shown in FIG. 1, another semiconductor production bays, e.g., a photolithography bay, an etching bay and a diffusion bay, have the same structure as the thin film bay.

The cell management portion 112 includes a cell management server 114 for transferring data messages and generating transaction, and an operation interface server 116 for allowing an operator to interface with the cell management server 114.

Hereinafter, an operation of the semiconductor factory automation system in accordance with the present invention will be described in detail.

After a process equipment EQ completes a processing of a lot under a control of the equipment server 130, a processed lot is transferred to the test equipment 150 by using the automatic guided vehicle AGV and then the test equipment 150 tests the processed lot to produce a real-time lot process data. The test equipment server 132 receives and transmits the real-time lot process data from the test equipment 150 to the equipment interface server 128. Additionally, the real-time lot process data is transmitted to the real-time database 110 through the cell management server 114, thereby being stored in the real-time database 110.

The equipment interface server 128 compares the real-time lot process data from the test equipment server 150 with the lot specification data transmitted from the real-time database 110 through the cell management server 114. As the result of the comparison, if a difference between the real-time lot process data and the lot specification data is within the predetermined range, the processed lot is considered as a normally manufactured lot so that a following process of the lot is continued in another process equipment.

On the other hand, if the difference between the real-time lot process data and the lot specification data exceeds or falls below the predetermined range, the processed lot is considered as an abnormally manufactured lot. Therefore, in processing the lot at another equipment, the equipment does not process the lot any longer until desirable action is taken to the lot.

In case where it is determined that the difference between the real-time lot process data and the lot specification data exceeds or falls below the predetermined range, the equipment interface server 128 generates a first message representing an occurrence of an abnormally manufactured lot. Then, the cell management server 114 generates, in response to the first message, a first transaction representing that the current lot is abnormally manufactured.

The first transaction is transmitted to the real-time database 110, so that the first transaction associated with the corresponding lot is stored in the real-time database 110.

Furthermore, the first transaction is also transmitted to the temporary storage unit 120 so that the first transaction is stored in a form of a temporary file. Then, the cell management server 114 generates a second message informing the history interface server 122 that the first transaction is stored in the temporary storage unit 120. The history interface server 122 reads out the first transaction stored in the temporary storage unit 120 in response to the second message to store it into the history database 124. Therefore, the first transaction is stored in the history database 124 as a history data associated with the lot.

When the abnormally manufactured lot occurs, an operator takes necessary action and inputs data relating to the action through the operator interface server 116. For example, if the cause of the abnormally manufactured lot is an equipment conditions, an operator changes the equipment conditions through the operator interface server 116 or stops the operation of the corresponding equipment. If the cause of the abnormally manufactured lot is the lot itself, an additional process is carried out or the lot itself or some wafers is terminated. Then, an operator inputs data relating to the action taken through the operator interface server 116. The data relating to the action taken are also stored in the real-time database 110 and the history database 124 through the cell management server 114.

At this time, if the cause of the abnormally manufactured lot is the lot itself, the cell management server 114 receives the data from the operator interface server 116 after necessary action is taken, and generates a second transaction allowing the corresponding lot to be processed.

The second transaction is also stored into the real-time database 110 through the cell management server 114. Additionally, in similar manner with the first transaction, the second transaction is transmitted to the temporary storage unit 120, so that the second transaction is stored in the temporary storage unit 120 in a form of a temporary file. Then, the cell management server 114 generates a third message informing the history interface server 122 that the second transaction is stored in the temporary storage unit 120. Thereafter, the history interface server 122 reads out the second transaction stored in the temporary storage unit 120 to output it to the history database 124 in response to the third message. As a result, the history database 124 stores the second transaction as a history data with respect to the corresponding lot.

As described above, when the abnormally manufactured lot is to be processed in another equipment for a following process, corresponding equipment server checks a lot data associated with the lot. If the lot data has only the first transaction, the equipment server considers the lot as an abnormally manufactured lot. Therefore, any processing to the corresponding lot is prevented. However, if the lot data has the first and second transaction, that is, the necessary action is taken to the abnormally manufactured lot, the lot is continued to be processed in corresponding process equipment.

Figure 2B:
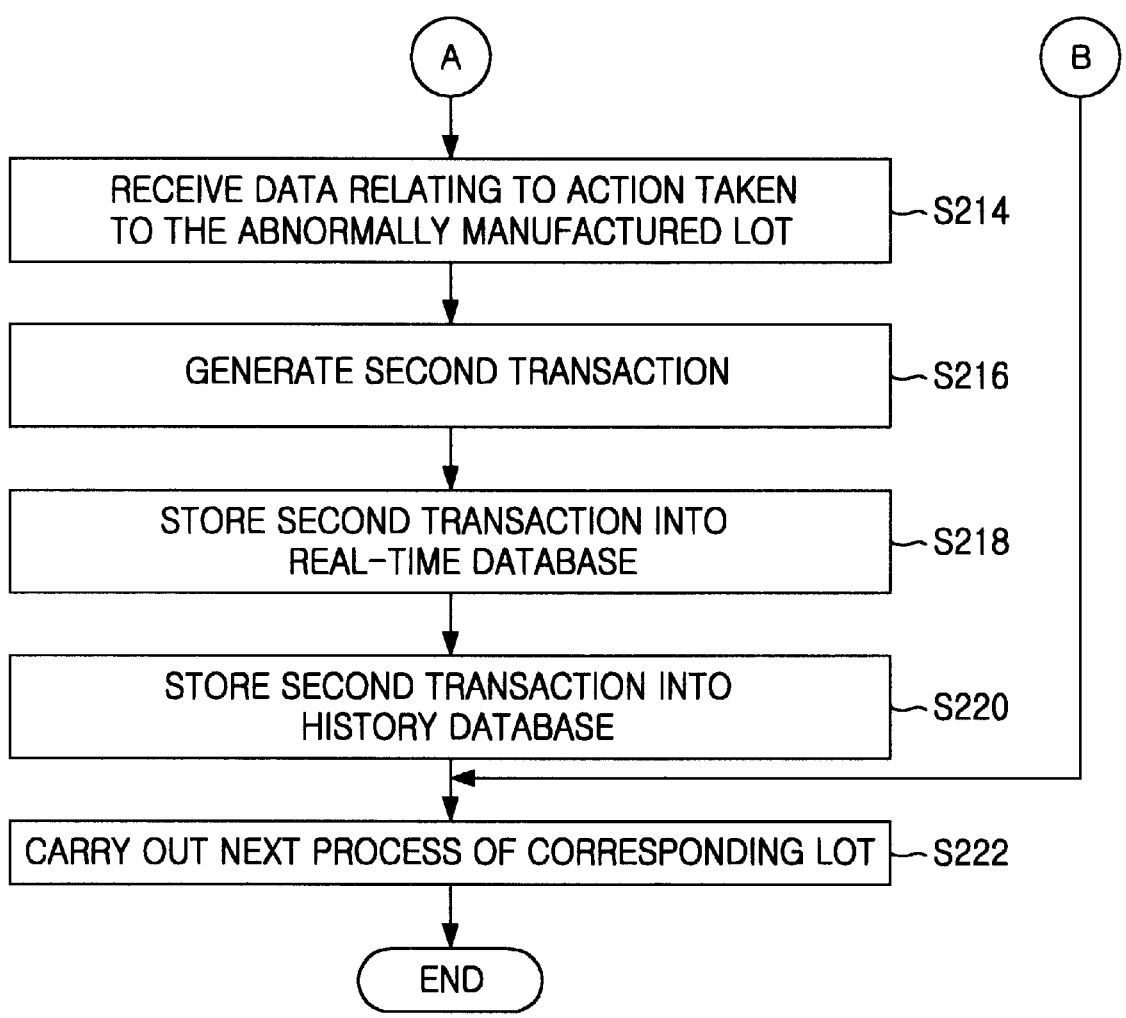

Hereinafter, a method for automatically controlling a semiconductor manufacturing process in accordance with the present invention will be described with reference to FIGS. 2A and 2B.

First, at step S200, the equipment interface server 128 receives the real-time lot process data from the test equipment 150 through the test equipment server 132, and the lot specification data transmitted from the real-time database 110 through the cell management server 114.

At step S202, the equipment server 128 compares the real-time lot process data with the lot specification data to determine whether a difference between the real-time lot process data with the lot specification data is within a predetermined range, set by an operator.

At step S204, as a result of the comparison, if the difference between the real-time lot process data and the lot specification data is within a predetermined range, the corresponding lot is considered to be normally manufactured so that a following process to the lot is continued without any holding of lot process.

At step S206, if the difference between the real-time lot process data and the lot specification data exceeds or falls below the predetermined range, the equipment interface server 130 generates a first message representing an occurrence of an abnormally manufactured lot.

At step S208, the cell management server 114 generates, in response to the first message, a first transaction representing that the corresponding lot is abnormally manufactured.

At step S210, the first transaction is transmitted to the real-time database 110 through the cell management server 114, and therefore, the first transaction is stored in the real-time database 110.

At step S212, the cell management server 114 transmits the first transaction to the temporary storage unit 120, and then generates a second message informing the history interface server 116 that the first transaction is stored in the temporary storage unit 120. The history interface server 122 reads out the first transaction stored in the temporary storage unit 120 in response to the second message, and outputs the first transaction to the history database 124. Therefore, the first transaction is stored into the history database 124.

At step S214, necessary action is taken, and data relating to the action is inputted through the operator interface server 116. The data relating to the action taken are stored in the real-time database 110 and the history database 124 through the cell management server 114.

At step S216, the cell management server 114 receives the data from the operator interface server 116, and then generates a second transaction allowing the corresponding lot to be processed.

At step S218, the second transaction is transmitted to the real-time database 110 through the cell management server 114, and therefore, the second transaction is stored in the real-time database 110.

At step S220, the cell management server 114 transmits the second transaction to the temporary storage unit 120, and then generates a third message informing the history interface server 116 that the second transaction is stored in the temporary storage unit 120. The history interface server 122 reads out the second transaction stored in the temporary storage unit 120 in response to the third message, and outputs the second transaction to the history database 124. Therefore, the second transaction is stored into the history database 124.

At step S222, next process to the corresponding lot is carried out at another process equipment under a control of a corresponding equipment server. That is, when the equipment server checks the corresponding lot data stored in the real-time database 110, if the lot data has only the first transaction, the equipment server considers the lot as an abnormally manufactured lot. Therefore, any processing to the corresponding lot is prevented. However, if the lot data has the first and second transaction, that is, the necessary action is taken to the abnormally manufactured lot, the corresponding lot is processed in the process equipment.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. An apparatus for automatically controlling a semiconductor manufacturing process in a semiconductor factory automation system, comprising:

a common communication line;

a plurality of process equipments, coupled to the common communication line, each of said equipments processing a lot;

a plurality of equipment control means, each controlling the process equipment according to commands from an exterior;

a plurality of test equipments, each testing the processed lot to generate lot process data;

a plurality of test equipment control means, each receiving the lot process data to transfer the lot process data;

a storage means for storing the lot process data, wherein the storage means previously storing a lot specification data, respectively;

a comparison means, coupled to the common communication line, for comparing the lot process data with the lot specification data to determine whether a difference between the processed lot data and the lot specification data exceeds or falls below a predetermined range, wherein if the difference exceeds or falls below the predetermined range, the comparison means generates a first message representing an occurrence of an abnormally manufactured lot; and a transaction generation means, coupled to the common communication line, for generating a first transaction in response to the first message, the first transaction representing that the lot is abnormally manufactured, and a second transaction when a cause of the abnormally manufactured lot is in the lot itself;

a history management means for storing the first transaction and the second transaction in association with said abnormally manufactured lot as a lot history;

wherein a subsequent process equipment of said plurality of process equipments accesses said lot history and then, if the lot history has only said first transaction stored in association with said abnormally manufactured lot, a next lot process to said abnormally manufactured lot is prevented and, conversely, if the lot history has the both the first transaction and the second transaction stored in association with said abnormally manufactured lot, processing of the abnormally manufactured lot is continued.

2. The apparatus as recited in claim 1, wherein the transaction generation means generates a second message and a third message informing that the first transaction and the second transaction, respectively, are transmitted to the history management means.

3. The apparatus as recited in claim 2, wherein the history management means includes:
   a temporary storage means for storing the first transaction and the second transaction transmitted from the transaction generation means in a form of temporary file;
   a history interface means, in response to the second message and the third message, for reading out the first transaction and the second transaction stored in the temporary storage means to output the first transaction to an exterior; and
   a history storage means for storing the first transaction and the second transaction outputted from the history interface means.

4. The apparatus as recited in claim 3, further comprising:
   an operator interface means for receiving data relating to an action taken to the abnormally manufactured lot.

5. A method for automatically controlling a semiconductor manufacturing process in a semiconductor factory, comprising the steps of:
   a) receiving a lot specification data and a lot process data;
   b) comparing the lot specification data with the lot process data to determine whether a difference between the lot specification data and the lot process data is within a predetermined range;
   c) if a difference between the lot specification data and the lot process data exceeds or falls below a predetermined range, generating a first message representing an occurrence of an abnormally manufactured lot;
   d) generating a first transaction in response to the first message, the first transaction representing that the lot is abnormally manufactured, and generating a second transaction when a cause of the abnormally manufactured lot is in the lot itself;
   e) storing the first transaction and the second transaction in association with said abnormally manufactured lot into a storage means as a lot history;
   f) transmitting the first transaction and the second transaction to a history management means; and
   g) generating a second message and a third message informing that the first transaction and the second transaction, respectively, are transmitted to the history management means;
   accessing, by a subsequent process equipment of said plurality of process equipments, the lot history and then, if the lot history has only the first transaction stored in association with the abnormally manufactured lot, preventing a next lot process to the abnormally manufactured lot and, conversely, if the lot history has both the first transaction and the second transaction stored in association with the abnormally manufactured lot, continuing with processing of the abnormally manufactured lot.

6. The method as recited in claim 5, wherein the step a) includes the steps of:
   a1) processing a lot in an equipment;
   a2) testing the processed lot to generate the lot process data;
   a3) transmitting the lot process data to a comparison means; and
   a4) transmitting the lot specification data to the comparison means, wherein the lot specification data is stored in the storage means.

7. The method as recited in claim 6, further comprising the step of storing the lot process data into the storage means.

8. The method as recited in claim 5, wherein the history management means includes:
   a temporary storage means for storing the first transaction and the second transaction in a form of temporary file;
   a history interface means, in response to the second message and the third message, for reading out the first transaction and the second transaction stored in the temporary storage means; and
   a history storage means for storing the first transaction and the second transaction outputted from the history interface means.

9. A method for automatically controlling a semiconductor manufacturing process in a semiconductor factory using an equipment interface server, a cell management server, and a history interface server, comprising the steps of:
   receiving a lot specification data and a lot process data;
   comparing, by said equipment interface server, the lot specification data with the lot process data to determine whether a difference between the lot specification data and the lot process data is within a predetermined range;
   generating by said equipment interface server, if a difference between the lot specification data and the lot process data exceeds or falls below a predetermined range, a first message representing an occurrence of an abnormally manufactured lot;
   generating, in response to said first message, a first transaction by said cell management server, said first transaction representing that the lot is abnormally manufactured;
   storing the first transaction in a temporary file;
   generating, in response to storage of said first transaction in said temporary file, a second message by said cell management server;
   reading out, by said history interface server in response to said second message, the first transaction stored in the temporary file and storing the first transaction to a lot history associated with said lot;
   receiving data relating to action taken to the abnormally manufactured lot;
   generating, by said cell management server, a second transaction when a cause of the abnormally manufactured lot is in the lot itself, said second transaction allowing processing of said abnormally manufactured lot to continue;
   storing the second transaction in a temporary file;
   generating, in response to storage of said second transaction in said temporary file, a third message by said cell management server;
   reading out, by said history interface server in response to said third message, the second transaction and storing the second transaction to said lot history;
   accessing, by a subsequent process equipment of said plurality of process equipments, the lot history and then, if the lot history has only the first transaction stored in association with the abnormally manufactured lot, preventing a next lot process to the abnormally manufactured lot and, conversely, if the lot history has both the first transaction and the second transaction stored in association with the abnormally manufactured lot, continuing with processing of the abnormally manufactured lot.

* * * * *